(12) United States Patent
Han

(10) Patent No.: US 11,908,407 B2
(45) Date of Patent: Feb. 20, 2024

(54) LIGHT EMITTING DISPLAY DEVICE AND COMPENSATION METHOD THEREOF

(71) Applicant: LG DISPLAY CO., LTD., Seoul (KR)

(72) Inventor: Jun Hee Han, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/976,770

(22) Filed: Oct. 29, 2022

(65) Prior Publication Data

US 2023/0215356 A1     Jul. 6, 2023

(30) Foreign Application Priority Data

Dec. 31, 2021   (KR) ........................ 10-2021-0194745

(51) Int. Cl.
    *G09G 3/3233*     (2016.01)
    *H10K 59/131*     (2023.01)
    *H10K 59/13*     (2023.01)

(52) U.S. Cl.
    CPC ......... *G09G 3/3233* (2013.01); *H10K 59/131* (2023.02); *G09G 2300/0426* (2013.01); *G09G 2300/0842* (2013.01); *G09G 2320/0233* (2013.01); *G09G 2320/0257* (2013.01); *G09G 2320/043* (2013.01); *H10K 59/13* (2023.02)

(58) Field of Classification Search
CPC ... G09G 3/3233; G09G 3/3291; H10K 59/131
See application file for complete search history.

(56) References Cited

FOREIGN PATENT DOCUMENTS

| KR | 10-2051640 B1 | 12/2019 |
|---|---|---|
| KR | 10-2020-0009671 A | 1/2020 |
| KR | 10-2020-0076346 A | 6/2020 |

*Primary Examiner* — Sardis F Azongha
(74) *Attorney, Agent, or Firm* — POLSINELLI PC

(57) ABSTRACT

A light emitting display device and a compensation method thereof, wherein an optical characteristics detection portion overlapping a signal line is provided in a subpixel, and the optical characteristics detection portion is connected to one of source voltage lines used by the subpixel, whereby optical characteristics of the subpixel can be determined without loss in effective area of an emission portion and to easily compensate for an afterimage of a display panel.

17 Claims, 9 Drawing Sheets

LIGHT EMITTING DISPLAY DEVICE AND COMPENSATION METHOD THEREOF

CROSS-REFERENCE TO RELATED APPLICATION

This application claims the priority of Korean Patent Application No. 10-2021-0194745, filed on Dec. 31, 2021, which is hereby incorporated by reference in its entirety.

BACKGROUND

Field of the Disclosure

The present disclosure relates to a display device, and more particularly to a light emitting display device having a subpixel-specific detection pattern to monitor a light emitting element in real time and a compensation method thereof.

Description of the Background

With recent approach to a full-scale information age, displays capable of visually expressing electrical information signals have been rapidly developed. Correspondingly, various display devices having excellent performance, such as slimness, light weight, and low power consumption, have been developed and have rapidly replaced a conventional cathode ray tube (CRT).

Among the display devices, a light emitting display device has been considered as a competitive application in order to achieve compaction of the device and vivid color display without necessity of a separate light source.

The light emitting display device includes a plurality of subpixels, wherein each subpixel includes a light emitting diode and a circuit configured to drive the same. The light emitting display device displays an image as the result of light emission from the light emitting diode.

SUMMARY

Accordingly, the present disclosure is directed to a light emitting display device and a compensation method thereof that substantially obviate one or more problems due to limitations and disadvantages of the conventional art.

More specifically, the present disclosure to provide a light emitting display device configured such that a detection pattern is provided in a subpixel so as to overlap with a signal line and the detection pattern is detected through a source voltage line, whereby real-time compensation is achieved while maintaining the effective emission area in a display area, and a compensation method thereof.

In a light emitting display device according to the present disclosure and a compensation method thereof, an optical characteristics detection portion overlapping with a signal line is provided in a subpixel, and the optical characteristics detection portion is connected to one of source voltage lines, whereby it is possible to determine optical characteristics of the subpixel.

To achieve these features and other advantages and in accordance with the purpose of the disclosure, as embodied and broadly described herein, a light emitting display device includes a substrate having a plurality of subpixels, each subpixel including an emission portion and a pixel circuit, a signal line and a first source voltage line provided in the pixel circuit, the signal line and the first source voltage line intersecting each other, a light emitting element provided in the emission portion, the light emitting element including a first electrode, an organic layer, and a second electrode, a first electrode extension portion integrally formed with the first electrode, the first electrode extension portion extending from the first electrode so as to overlap with at least a part of the signal line, a connection pattern overlapping with the first electrode extension portion along the signal line, a photovoltaic material provided between the connection pattern and the first electrode extension portion, and a detection pattern spaced apart from the photovoltaic material, one side of the detection pattern being connected to the first electrode extension portion along the signal line, the other side of the detection pattern being connected to the first source voltage line.

A compensation method of the light emitting display device may include operating the light emitting element of the emission portion in the same subpixel so as to emit light and generating a photovoltaic signal from photovoltaic material of the pixel circuit, transmitting the photovoltaic signal from the photovoltaic material to the first source voltage line via the connection pattern and the detection pattern, and detecting optical characteristics of the subpixel from which the photovoltaic signal has been generated through the driver connected to the first source voltage line.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION

Figure 1:
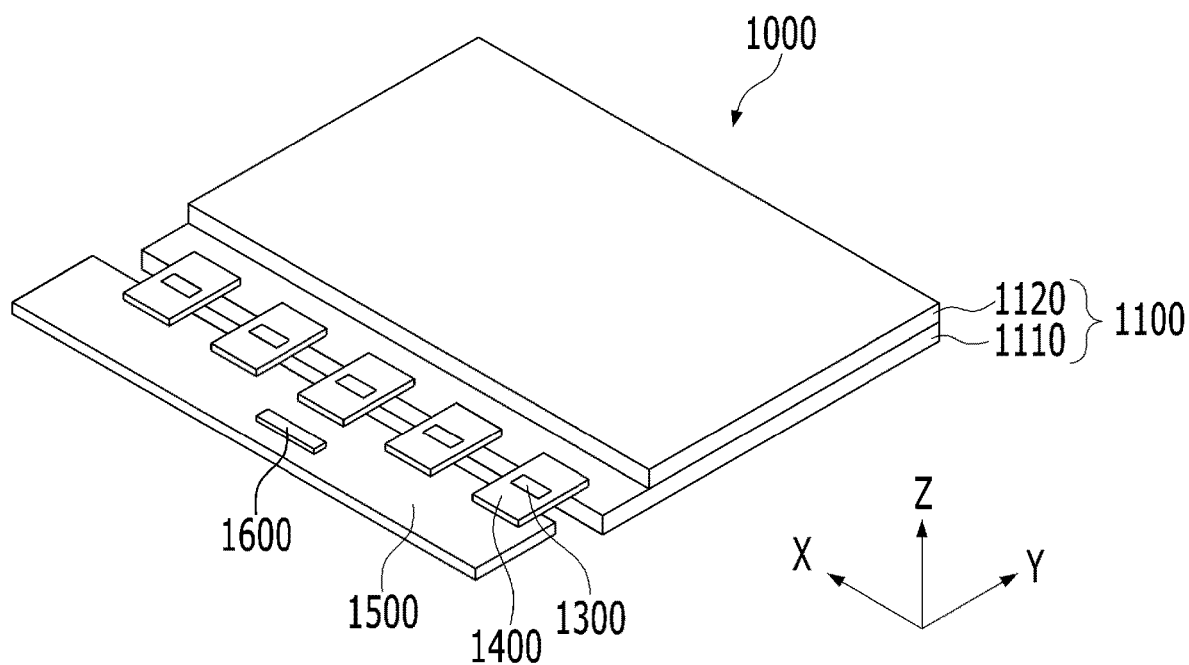
FIG. 1 is a perspective view showing a light emitting display device according to the present disclosure.

Reference will now be made in detail to various aspects of the present disclosure, examples of which are illustrated in the accompanying drawings. Wherever possible, the same reference numbers will be used throughout the drawings to refer to the same or like parts. In the following description of the present disclosure, detailed descriptions of known functions and configurations incorporated herein will be omitted when the same may obscure the subject matter of the present disclosure. In addition, the names of elements used in the following description are selected in consideration of clarity of description of the specification, and may differ from the names of elements of actual products.

The shape, size, ratio, angle, number, and the like shown in the drawings to illustrate various aspects of the present disclosure are merely provided for illustration, and the disclosure is not limited to the content shown in the drawings. Wherever possible, the same reference numbers will be used throughout the drawings to refer to the same or like parts. In the following description, detailed descriptions of technologies or configurations related to the present disclosure may be omitted so as to avoid unnecessarily obscuring the subject matter of the present disclosure. When terms such as "including", "having", and "comprising" are used throughout the specification, an additional component may be present, unless "only" is used. A component described in a singular form encompasses a plurality thereof unless particularly stated otherwise.

The components included in the aspects of the present disclosure should be interpreted to include an error range, even if there is no additional particular description thereof.

In describing the variety of aspects of the present disclosure, when terms describing positional relationships such as "on", "above", "under" and "next to" are used, at least one intervening element may be present between the two elements, unless "immediately" or "directly" is used.

In describing the variety of aspects of the present disclosure, when terms related to temporal relationships, such as "after", "subsequently", "next" and "before", are used, the non-continuous case may be included, unless "immediately" or "directly" is used.

In describing the variety of aspects of the present disclosure, terms such as "first" and "second" may be used to describe a variety of components, but these terms only aim to distinguish the same or similar components from one another. Accordingly, throughout the specification, a "first" component may be the same as a "second" component within the technical concept of the present disclosure, unless specifically mentioned otherwise.

Features of various aspects of the present disclosure may be partially or completely coupled to or combined with each other, and may be variously inter-operated with each other and driven technically. The aspects of the present disclosure may be carried out independently from each other, or may be carried out together in an interrelated manner.

Hereinafter, an organic light emitting display device will be mainly described as a light emitting display device according to the present disclosure; however, the material for a light emitting element used in the display device is not limited to an organic material. Depending on circumstances, a light emitting material may be an organic material, an inorganic material, such as a quantum dot semiconductor or a nitride semiconductor, or a compound of an organic material and an inorganic material, such as perovskite.

Figure 2:
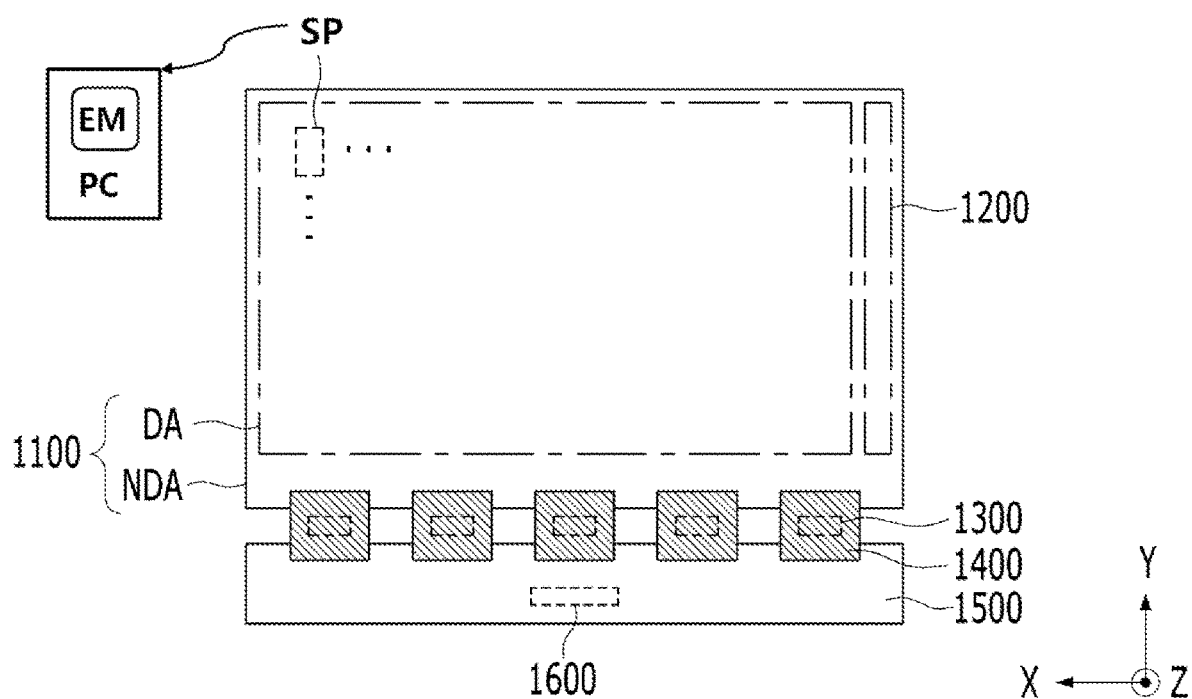
FIG. 2 is a plan view showing a substrate of FIG. 1.

FIG. 1 is a perspective view showing a light emitting display device according to the present disclosure, and FIG. 2 is a plan view showing a substrate of FIG. 1.

As shown in FIGS. 1 and 2, the light emitting display device 1000 according to the present disclosure may include a display panel 1100, a scan driver 1200, a data driver 1400, a circuit board 1500, and a timing controller 1600. The data driver 1400 may include a flexible film and a drive IC 1300 on the flexible film. In some cases, the data driver 1400 and/or the circuit board 1500 may function as a driver. As shown, the data driver 1400 may supply a data signal to a plurality of signal lines provided in the display panel 1100 through several blocks, and may detect a sensing signal, or may correspond to all signal lines provided in the panel 1100 so as to perform the function of the data driver. Depending on circumstances, the data driver 1400 and the circuit board 1500 may be integrated and it can be called as a driver.

The display panel 1100 may include an array substrate 1110 and an opposite substrate 1120. Each of the array substrate 1110 and the opposite substrate 1120 may include a glass or plastic substrate, and may further include a thin film transistor array, a color filter array, or an optical film. For example, when the array substrate 1110 includes the plastic substrate, the plastic constituting the substrate may be polyimide, polyethylene terephthalate (PET), polyethylene naphthalate (PEN), or polycarbonate (PC). When the array substrate 1110 includes the plastic substrate, the light emitting display device 1000 may be implemented by a flexible display device that can be curved or bent. The opposite substrate 1120 may include any one of glass, a plastic film, and an encapsulation film. When the opposite substrate 1120 is the encapsulation film, the encapsulation film may have a unit structure in which organic films and inorganic films are alternatively disposed, and the films may be formed on the array substrate 1110 without being bonded to the array substrate 1110.

The array substrate 1110 is a thin film transistor substrate on which thin film transistors are formed. Scan lines, signal lines, and subpixels SP are formed on one surface of the array substrate 1110 that faces the opposite substrate 110. The subpixels SP are provided at areas defined by intersections between the scan lines and signal lines. The scan lines are connected to the scan driver 1200, and the signal lines are connected to the data driver 1400. In addition, as shown, the scan driver 1200 may be directly mounted in a non-display area NDA of the array substrate 1110, or a separate drive IC or a printed circuit film may be connected to the non-display area NDA of the array substrate 1110.

As shown in FIG. 2, the display panel 1110 may be divided into a display area DA, in which the subpixels SP are formed to display an image, and a non-display area NDA, in which no image is displayed. The scan lines, the signal lines, and the subpixels SP may be formed in the display area DA. The scan driver 1200, pads, and link lines configured to connect the signal lines to the pads may be formed in the non-display area NDA.

Each subpixel SP may be divided into an emission portion EM, which substantially emits light, and a pixel circuit PC disposed outside the emission portion EM, the pixel circuit PC having a line and a transistor provided therein.

The pixel circuit PC of the subpixel SP may include a plurality of transistors as switching elements configured to be turned on according to scan signals of the scan lines to receive data voltage of the signal lines. Each transistor may be a thin film transistor. The transistors of the subpixel SP may have the same stack structure having active layers formed on the same layer or a hetero stack structure having active layers formed on different layers.

The light emitting display device according to the present disclosure is characterized in that an optical characteristics detection portion OPT (see FIG. 3) is provided in the pixel circuit without loss of the emission portion EM in each pixel SP.

Hereinafter, subpixels of the light emitting display device according to the present disclosure will be described in detail.

Figure 3:
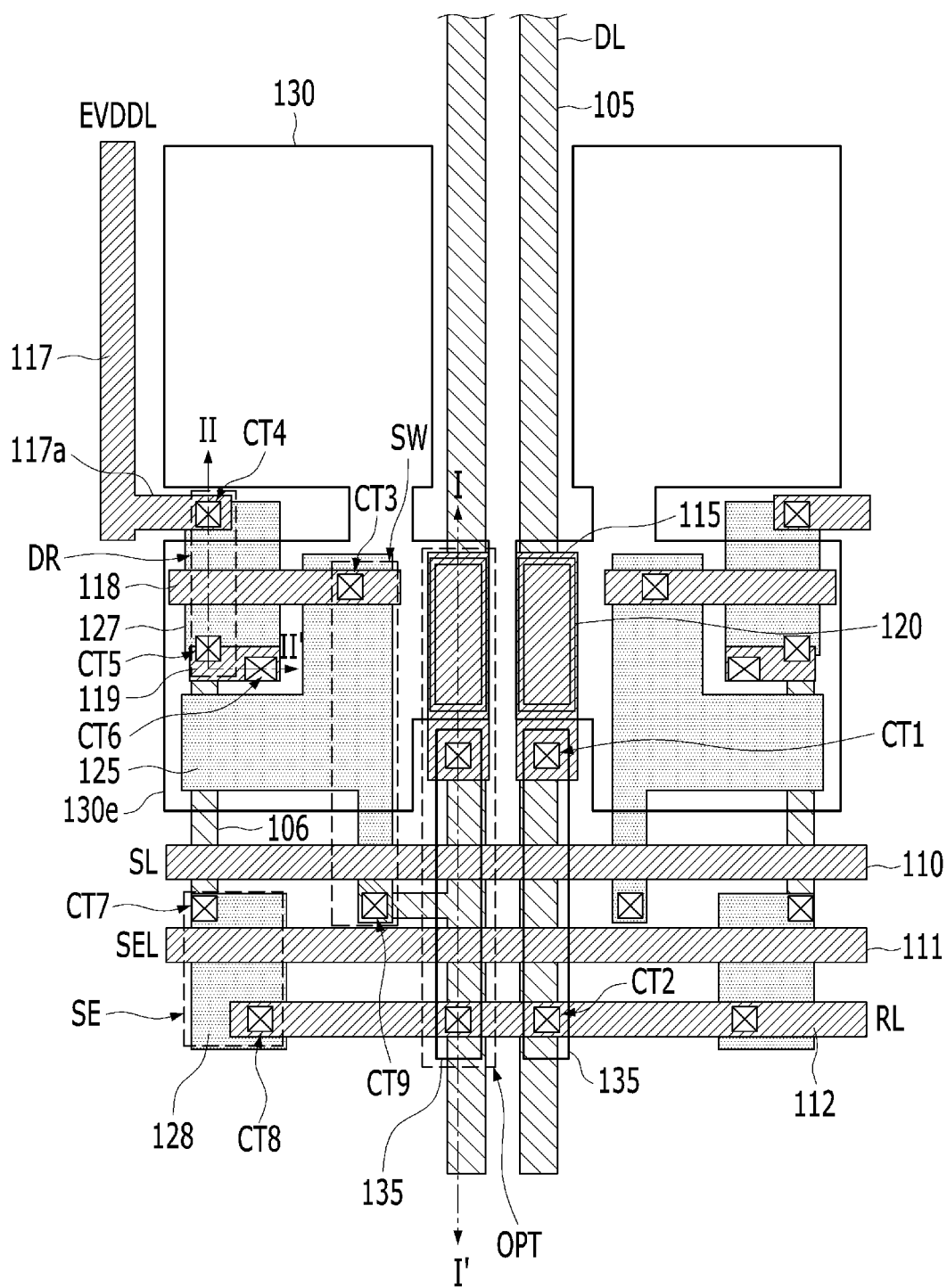
FIG. 3 is a plan view showing two adjacent subpixels in a light emitting display device according to an aspect of the present disclosure.
Figure 4:
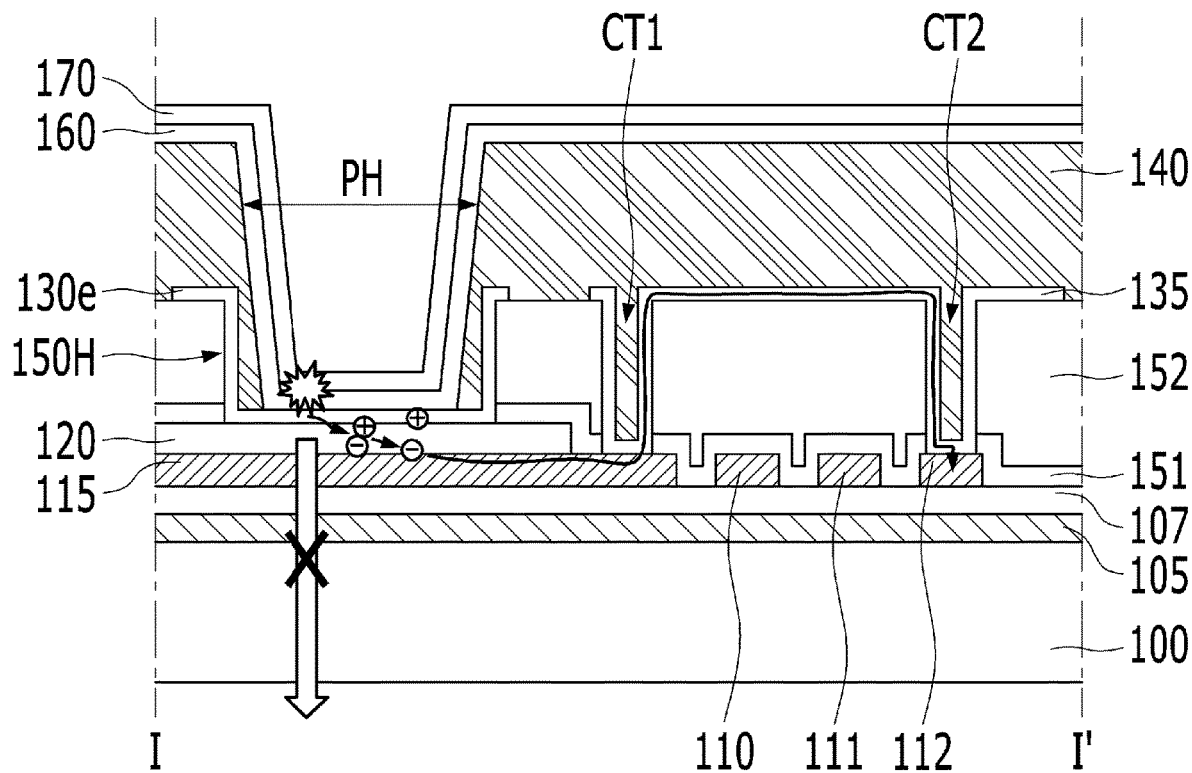
FIG. 4 is a cross-sectional view taken along line I-I' of FIG. 3.
Figure 5:
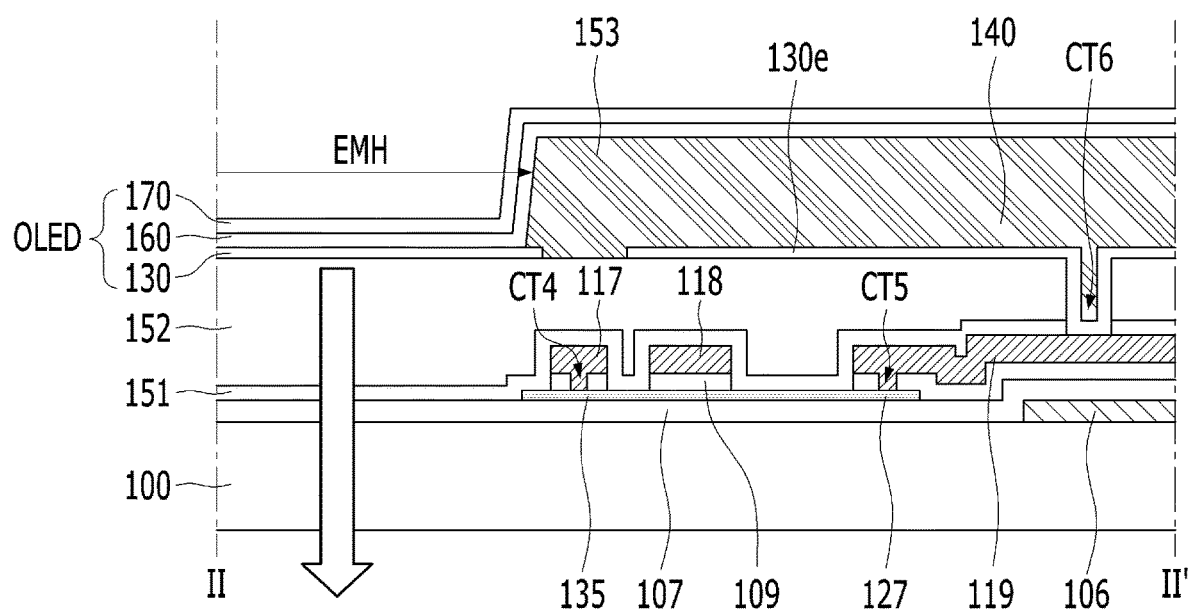
FIG. 5 is a cross-sectional view taken along line II-II' of FIG. 3.
Figure 6:
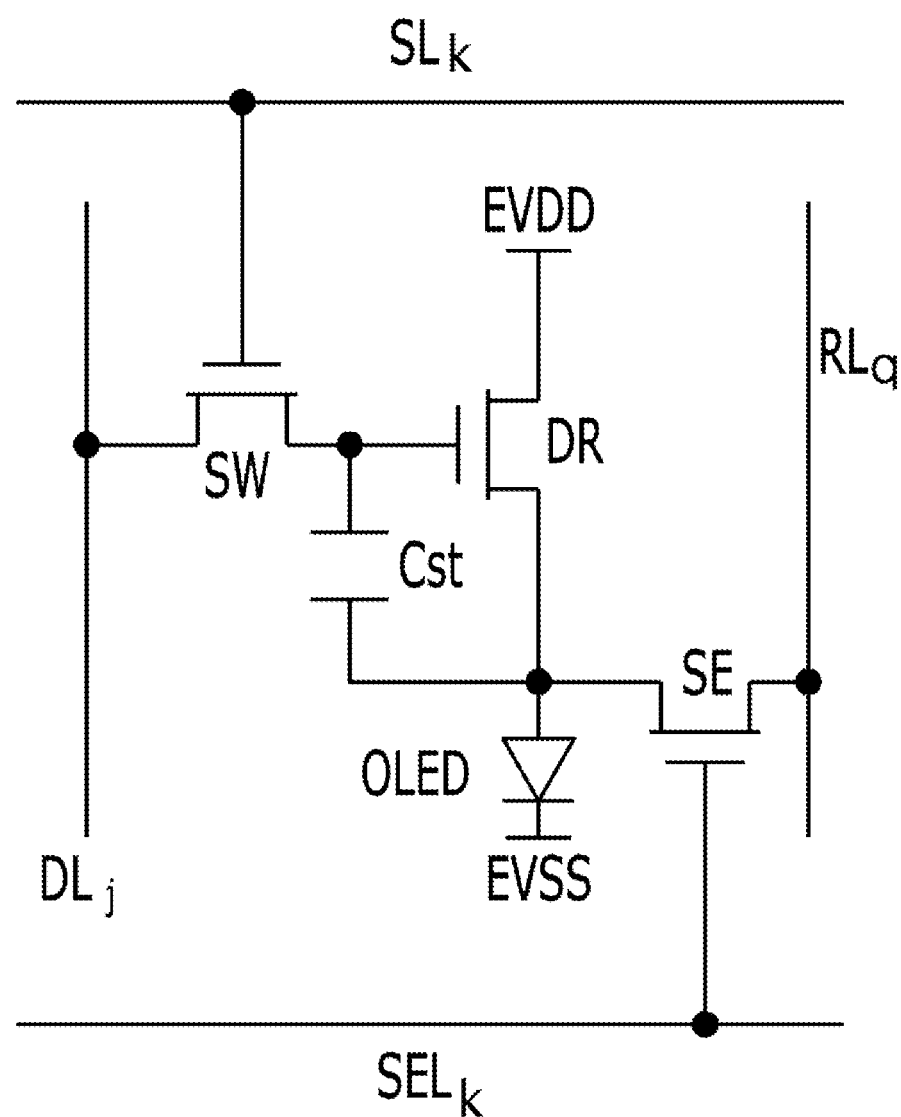
FIG. 6 is a circuit diagram corresponding to one subpixel of FIG. 3.

FIG. 3 is a plan view showing two adjacent subpixels in a light emitting display device according to an aspect of the present disclosure, FIG. 4 is a sectional view taken along line I-I' of FIG. 3, and FIG. 5 is a sectional view taken along line II-II' of FIG. 3. FIG. 6 is a circuit diagram corresponding to one subpixel of FIG. 3.

As shown in FIGS. 3 to 6, the light emitting display device according to the present disclosure includes a substrate 100 having a plurality of subpixels SP, each subpixel including an emission portion EM and a pixel circuit PC, a signal line DL (105) and a first source voltage line RL (112) provided in the pixel circuit PC, the signal line and the first source voltage line intersecting each other, a light emitting element OLED provided in the emission portion EM, the light emitting element including a first electrode 130, an organic layer 160, and a second electrode 170, and an optical characteristics detection portion OPT provided so as to overlap with the signal line 105.

Here, the optical characteristics detection portion OPT may include at least a part of the first electrode extension portion 130e integrally formed with the first electrode 130, the first electrode extension portion 130e extending from the first electrode 130 so as to overlap with the signal line 105, a connection pattern 115 overlapping with the first electrode extension portion 130e along the signal line 105, a photovoltaic material layer 120 provided between the connection pattern 115 and the first electrode extension portion 130e, and a detection pattern 135 spaced apart from the photovoltaic material layer 120, one side of the detection pattern being connected to the first electrode extension portion 130e along the signal line 105, the other side of the detection pattern being connected to the first source voltage line RL (112).

That is, in the light emitting display device according to the present disclosure, an emissive material of the light emitting element OLED extends to the optical characteristics detection portion OPT in the pixel circuit. Consequently, light emitted from a specific subpixel is received by the optical characteristics detection portion OPT, which converts the light into a photovoltaic signal to determine optical characteristics of the subpixel.

Here, the optical characteristics detection portion OPT converts light emitted from the subpixel into a current signal through the photovoltaic material layer 120, the current signal is transmitted to the first source voltage line 112 connected to the detection pattern 135 via the detection pattern 135, and the current signal may be transmitted to the data driver 1400 (see FIG. 1) connected to the first source voltage line 112. The current signal may be transmitted from the data driver 1400 to the circuit board 1500.

As shown in FIGS. 3 and 4, the construction extending along line I-I' of FIG. 3 corresponds to the optical characteristics detection portion OPT. This means that light emitted from the subpixel is converted into a photovoltaic signal by the photovoltaic material layer 120 and is detected through the connection pattern 115 and the detection pattern 135 abutting the photovoltaic material layer 120.

Optical characteristics detection of the subpixel through the optical characteristics detection portion OPT may be performed in real time during driving of the light emitting display device, or the detection pattern 135 or the driver connected to the first source voltage line 112 may sense characteristics of the subpixel during mass production of the light emitting display device, whereby luminance and luminance uniformity of the entirety of the display panel may be adjusted. When optical characteristics of the display panel are detected through the optical characteristics detection portion OPT in the subpixel during mass production, it is possible to detect the characteristics of the display panel even though a separate measuring instrument is provided outside the display panel.

Here, the detection pattern 135 may be made of the same material as the first electrode 130. At this time, the detection pattern 135 may be spaced apart from both the first electrode 130 and the first electrode extension portion 130e. The reason for this is that it is necessary for the detection pattern 135 to be electrically spaced apart from the first electrode 130 and the first electrode extension portion 130e so as to independently function.

The organic layer 160 may abut upper surfaces of the first electrode 130 and the first electrode extension portion 130e, and may not abut the detection pattern 135. The reason for this is that it is necessary for light emitted from the organic layer 160 to selectively affect the optical characteristics detection portion OPT overlapping with the signal line 105, particularly the region in which the photovoltaic material layer 120 is located. To this end, in the region other than the region in which the organic layer 160 of the optical characteristics detection portion OPT abuts the first electrode extension portion 130e, a bank 140 may be further provided between the layer of the first electrode extension portion 130e and the detection pattern 135 and the organic layer 160.

The photovoltaic material layer 120 may include at least one of PTB7, PTB7-Th, $PC_{71}BM$, PTDB-T, and ITIC. The photovoltaic material layer 120 may be a material corresponding to each of Chemical Formulas 1 to 5.

[Chemical Formula 1]

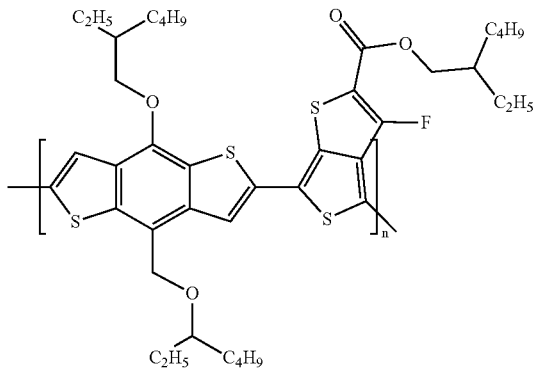

[Chemical Formula 2]

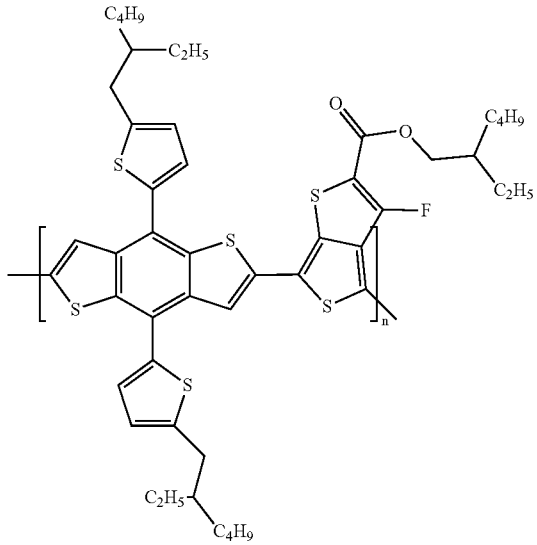

[Chemical Formula 3]

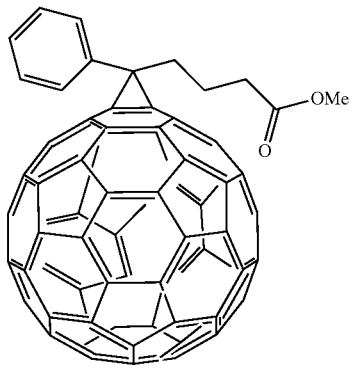

[Chemical Formula 4]

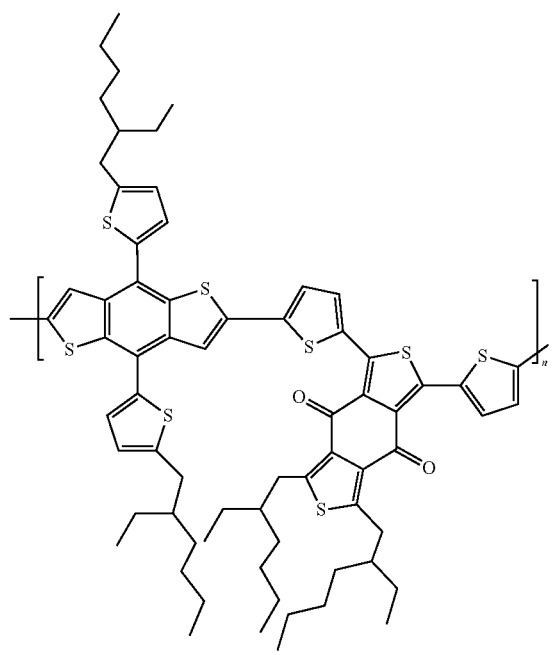

[Chemical Formula 5]

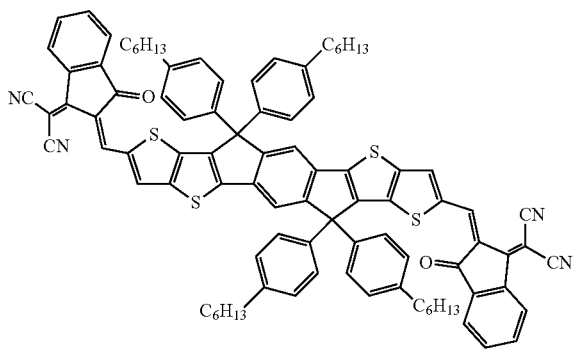

However, the material constituting the photovoltaic material layer 120 may not be limited to the material represented by each of Chemical Formulas 1 to 5. Any other material may be used as long as the material has a photovoltaic effect of, when light is incident on one surface of the material, changing the same to a current signal and is capable of generating current sufficient to sense the amount of light that is emitted from the subpixel.

In the light emitting display device according to the present disclosure, the photovoltaic material layer 120 must receive light emitted from the first electrode extension portion 130e, and therefore each of the first electrode 130 and the first electrode extension portion 130e may be a transparent electrode. In this case, each of the first electrode 130 and the first electrode extension portion 130e may be made of a transparent oxide metal, such as ITO, IZO, and ITZO. At this time, as shown in FIG. 5, light emitted from the organic layer 160 of the light emitting element OLED located in the emission portion EM may be emitted outside through the substrate 100 via the first electrode 130.

In this case, the second electrode 170 opposite the first electrode 130 in the light emitting element OLED may be a reflective electrode made of a reflective metal, such as aluminum (Al), silver (Ag), magnesium (Mg), or ytterbium (Yb), or a reflective alloy including at least one thereof. Consequently, light emitted from the organic layer 160 is emitted to the first electrode 130 while being repeatedly reflected and re-reflected between the transparent first electrode 130 and the reflective second electrode 170 due to resonance.

However, the aspect of the light emitting display device according to the present disclosure is not limited to the case in which the first electrode 130 and the first electrode extension portion 130e are the same transparent electrodes. The first electrode 130 may include a reflective electrode and a transparent electrode, and the reflective electrode may be removed from the region of the first electrode extension portion 130e corresponding to the photovoltaic material layer 120 such that only the transparent electrode remains, whereby the light emitting element OLED may perform top emission, and light emitted from the organic layer 160 only in the area in which the photovoltaic material layer 120 is provided may be directed to the first electrode extension portion 130e.

In addition, the detection pattern 135 may be made of the same material as the first electrode 130 and the first electrode extension portion 130e and may be formed on the same layer as the first electrode 130 and the first electrode extension portion 130e. The reason for this is that it is necessary to simultaneously form the detection pattern 135 during formation of the first electrode 130 without addition of a separate material.

The detection pattern 135 is configured to sense a photovoltaic signal generated from the photovoltaic material layer 120, i.e. current, and to transmit the same to the first source voltage line 112 via the connection pattern 115 located under the photovoltaic material layer 120. The detection pattern 135 is located so as to be electrically spaced apart from the first electrode 130 and the first electrode extension portion 130e.

Not only when the first electrode 130 and the first electrode extension portion 130e are made of the same material and are formed on the same layer but also when the first electrode 130 includes a reflective material, unlike the first electrode extension portion 130e, the detection pattern 135 is spaced apart from the first electrode 130 and the first electrode extension portion 130e.

The photovoltaic material layer 120 is located immediately under the first electrode extension portion 130e so as to overlap with the signal line 105, whereby a light reception effect is improved. In addition, the organic layer 160 directly abuts the first electrode extension portion 130e on the photovoltaic material layer 120, whereby light emitted from the organic layer 160 is transmitted to the photovoltaic material layer 120 without any change through the first electrode extension portion 130e.

The subpixel SP may be provided with a bank 140 having a first hole EMH with respect to the emission portion EM in order to partition the emission portion EM (see FIG. 2). The light emitting display device according to the present disclosure further includes a second hole PH formed in a region of the bank 140 corresponding to the photovoltaic material layer 120, in addition to the first hole EMH formed when the bank is provided.

The second hole PH may have a size corresponding to or similar to the size of the photovoltaic material layer 120. As long as the photovoltaic material layer 120 is capable of receiving light emitted from the organic layer 160 and converting the same into a photovoltaic signal, the second hole PH may have a size different from the size of FIG. 4. However, the second hole PH is provided for detection in order to compensate for the subpixel when the subpixel is degraded, and does not affect emission of the emission portion EM.

The bank 140 is provided between the layer of the first electrode 130 and the first electrode extension portion 130e and the organic layer 160.

The bank 140 has the first hole EMH configured to expose the region of the emission portion corresponding to the first electrode 130 and the second hole PH configured to expose the first electrode extension portion 130e on the connection pattern 115.

Meanwhile, as shown in FIG. 4, the signal line 105 according to the present disclosure, which is connected to the data driver, may be located lower than the connection pattern 115, the photovoltaic material layer 120, and the first electrode extension portion 130e to prevent light generated from the organic layer 160 in the second hole PH from leaking to under the lower part and the side of the substrate 100. In addition, it is possible to prevent a current signal generated from the photovoltaic material layer 120 from affecting the lower side of the signal line 105.

The signal line 105 may be a data line DL, and the first source voltage line RL (112) may be a reference source voltage line configured to supply reference voltage. In the subpixel SP, the first source voltage line 112 may be disposed so as to intersect the signal line 105, or may be connected to a vertical connection line extending to the data driver 1400 and the circuit board 1500 (see FIG. 1) at the outside thereof or in a part of the display area. The first source voltage line 112 and the signal line 105 intersecting each other in the subpixel are located on different layers.

A buffer layer (not shown) made of a nitride film, an oxide film, or an oxynitride film may be further provided between the signal line 105 and the substrate 100, and the buffer layer may have a single-layered structure or a multilayered structure. The signal line 105 may be a light blocking metal. In some cases, the light blocking metal at a same layer as the signal line 105 may be further provided under channels of each active layer 125, 127, and 128 of the switching transistor SW, the driving transistor DR and the sense transistor SE. The light blocking metal may block a light entering from a lower side of the substrate 100 from being transmitted to the active layers 125, 127 and 128.

The connection pattern 115 and the photovoltaic material layer 120 are formed so as to abut each other, and a photovoltaic signal is generated in a stack structure in which the connection pattern 115, the photovoltaic material layer 120, and the first electrode extension portion 130e are connected to each other.

Passivation films 151 and 152 may be further included between the photovoltaic material layer 120 and the first electrode extension portion 130e excluding the connection therebetween. The passivation films 151 and 152 may be passivation films configured to protect the thin film transistor provided in the pixel circuit PC of the subpixel. The first passivation film 151 may be an inorganic film, and the second passivation film 152 thereon may be an organic film, an upper surface of which can be planarized. At least one of the first and second passivation films 151 and 152 may have a multilayered structure.

The connection pattern 115 can be connected to the detection pattern 135 by a first contact hole CT1 in the first passivation film 151 and the second passivation film 152. The detection pattern 135 can be connected to the first source voltage line 112 by a second contact hole CT2 in the first passivation film 151 and the second passivation film 152.

The construction of the pixel circuit PC excluding the optical characteristics detection portion OPT will be described.

The pixel circuit PC includes a scan line SL (110) and a sense line SEL (111) extending so as to intersect the detection pattern 135 between one side and the other side of the detection pattern 135, a switching transistor SW spaced apart from the optical characteristics detection portion OPT while overlapping with the scan line 110, a sensing transistor SE spaced apart from the optical characteristics detection portion OPT while overlapping with the sense line 111, and a driving transistor DR spaced apart from the optical characteristics detection portion OPT.

As shown in FIG. 4, the scan line 110, the sense line 111, the first source voltage line 112 can be disposed at a same layer. However, the embodiment in the present disclosure is not limited thereto.

As shown in FIG. 4, an active buffer layer 107 can be disposed between the signal line 105 and the connection pattern 115.

Here, as shown in FIGS. 3-5, the driving transistor DR includes a gate electrode 118 connected to the switching transistor SW, a second active layer 127, a source electrode 119 connected to the first electrode 130 or the first electrode extension portion 130e together with the sensing transistor SE, and a drain electrode 117a opposite the source electrode 119 based on the gate electrode 118. The drain electrode 117a of the driving transistor is connected to a second source voltage line EVDDL (117) configured to supply driving source voltage EVDD. The second source voltage line 117 may be shared by adjacent subpixels. As shown in FIG. 3, therefore, in the subpixel SP, the second source voltage line 117 may be formed to be parallel to the signal line 105 and the second source voltage line 117 has a drain electrode 117a of the driving transistor DR in a vertical direction to the signal line 105. Thus, the drain electrode 117a of the driving transistor DR extends to adjacent left and right subpixels in an intersecting direction to the second voltage line 117. The drain electrode 117a is connected to one side of the second active layer 127 by a fourth contact hole CT4 and the source electrode 119 is connected to the other side of the second active layer 127 by a fifth contact hole CT5. A gate insulating layer 109 may be disposed between the second active layer 127 and the gate electrode 118. The fourth contact hole CT4 and the fifth contact hole CT5 may be disposed in the gate insulating layer 109. The source electrode 119 of the driving transistor DR may be connected to the sense transistor SE by an electrode pattern extended from a source electrode 106 of the sense transistor SE. The electrode pattern from the source electrode 106 of the sense transistor SE is disposed at a same layer as the signal line 105. Also, the source electrode 119 of the driving transistor DR may be connected to the first electrode extension portion 130e by a sixth contact hole CT6. The sixth contact hole CT6 may be disposed in the first and second passivation films 151 and 152.

In some cases, contrary to the above, the reference number 119 can be a drain electrode and the reference number 117 can be a source electrode in the driving transistor DR.

As shown in FIG. 3 and FIG. 6, the switching transistor SW may include the scan line SL as a gate electrode, a first active layer 125 overlapped with the scan line SL, a drain (source) electrode protruded from the signal line 105 and a source (drain) electrode extended from the gate electrode 118 of the driving transistor DR. The source electrode of the switching transistor SW is connected to one side of the first active layer 125 by a third contact hole CT3, and the drain electrode of the switching transistor SW is connected to the other side of the first active layer 125 by a ninth contact hole CT9. The third contact hole CT3 and the ninth contact hole CT9 may be disposed in the gate insulating layer 109 as the fourth and fifth contact holes CT4 and CT5 as shown in FIG. 5.

As shown in FIG. 3 and FIG. 6, the sense transistor SE may include the sense line SEL as a gate electrode, a third active layer 128 overlapped with the sense line SEL, the source electrode 106 and a drain electrode extended from the first source voltage line 112. The source electrode of the sense transistor SE is connected to one side of the third active layer 128 by a seventh contact hole CT7, and the drain electrode of the sense transistor SE is connected to the other side of the third active layer 128 by an eighth contact hole CT8. The seventh hole CT7 and the eighth contact hole CT8 may be disposed in the gate insulating layer 109 as the fourth and fifth contact holes CT4 and CT5 as shown in FIG. 5.

The source electrode 119 of the driving transistor DR may be connected to the sense transistor SE by an electrode pattern 106. The electrode pattern 106 is disposed at a same layer as the signal line 105.

The first source voltage line 112 may be connected to the driver including the data driver 1400 and/or the circuit board 1500, whereby reference source voltage may be supplied into the subpixel and current or voltage from the detection pattern 135 may be sensed in different periods.

The scan line 110 and the sense line 111 are located on the same layer as the connection pattern 115, and the passivation films 151 and 152, which are configured to protect the switching transistor SW, the sensing transistor SE, and the driving transistor DR, are provided between the connection pattern 115, the scan line 110, and the sense line 111 and the detection pattern 135.

Each of the passivation films 151 and 152 may further include a passivation film hole 150H, through which a part of the photovoltaic material layer 120 is exposed, and the photovoltaic material layer 120 may abut the first electrode extension portion 130e via the passivation film hole 150H.

As shown in FIG. 3, the connection pattern 115, the photovoltaic material layer 120, and the detection pattern 135 of the optical characteristics detection portion OPT may be provided for each subpixel to detect optical characteristics of each subpixel in real time.

Depending on circumstances, the optical characteristics detection portion OPT may be provided for every two or more subpixels to detect optical characteristics of two or more subpixels in real time.

The photovoltaic material layer 120 may receive light emitted from the organic layer 160, may transmit a photovoltaic signal to the connection pattern 115, and may transmit the photovoltaic signal to the driver including the data driver 1400 and/or the circuit board 1500 outside the subpixels through the detection pattern 135.

The driver including the data driver 1400 and/or the circuit board 1500 may be provided therein with a compensation unit configured to compare the current or voltage value read from the subpixel SP with a reference value, to set a compensation current value and a correction voltage value, and to supply compensated reference source voltage to the first source voltage line.

Each of the organic layer 160 and the second electrode 170 may integrally extend from the emission portion EM to the photovoltaic material layer 120 of the pixel circuit PC. As shown in FIGS. 4 and 5, the organic layer 160 may be formed over the entirety of the display area of the substrate 100, or may be provided in an area including the emission portion EM and the optical characteristics detection portion OPT for each subpixel in the form of an island. In addition to an emission layer, the organic layer 160 may include a hole injection layer configured to inject holes from the first electrode 130, a hole transport layer configured to transport the holes from the hole injection layer to the emission layer, an electron transport layer configured to transport electrons to the emission layer, and an electron injection layer configured to inject electrons from the second electrode 170 to the electron transport layer. When the organic layer 160 has a multilayered structure, only the emission layer is selectively formed so as to be divided for each subpixel, and the hole injection layer, the hole transport layer, the electron transport layer, and the electron injection layer may be integrally formed in the display area DA (see FIG. 2) without division. The second electrode 170 may be integrally formed in the display area DA without division.

As shown in FIG. 4, the signal line 105 may be located closer to the substrate 100 than the connection pattern 115, the photovoltaic material layer 120, and the detection pattern 135 overlapping with each other. As a result, the signal line 105 may block light directed downwards through the second hole PH of the bank, thereby preventing an effect due to photovoltaic current.

Meanwhile, as shown in FIG. 6, each subpixel may further include a storage capacitor Cst capable of storing differential voltage between the gate electrode and the source electrode of the driving transistor DR in order to stabilize characteristics of the pixel circuit during driving of the light emitting element OLED.

The light emitting element OLED emits light upon receiving current through the driving transistor DR. The first electrode 130 (see FIG. 3) of the light emitting element OLED may be connected to the source electrode 119 (see FIG. 3) of the driving transistor DR, and the second electrode 170 (see FIG. 3) may be connected to a third source voltage line to which low source voltage EVSS or a ground voltage is supplied outside the display area DA (see FIG. 2) of the substrate 100 (see FIG. 4).

When voltage is applied to the first electrode 130 and the second electrode 170 of the light emitting diode OLED, holes and electrons move to the emission layer via the hole transport layer and the electron transport layer, respectively, and the holes and electrons are combined with each other in the emission layer, whereby light is emitted.

The driving transistor DR is disposed between the second source voltage line 117 (see FIG. 3) to which the driving source voltage EVDD is supplied and the light emitting element OLED. The driving transistor DR adjusts current that flows from the second source voltage line 117 to the light emitting element OLED based on voltage difference between the gate electrode and the source electrode. The gate electrode of the driving transistor DR may be connected to the source electrode of the switching transistor SW. The drain electrode may be connected to the second source voltage line 117. And the source electrode may be connected to the first electrode 130 of the light emitting element OLED.

The switching transistor SW is turned on by a k-th scan signal of a k-th scan line $SL_k$ to supply voltage from a j-th signal line $DL_j$ to the gate electrode of the driving transistor DR. A gate electrode of the switching transistor SW may be connected to the k-th scan line $SL_k$, the source electrode may be connected to the gate electrode of the driving transistor DR, and a drain electrode may be connected to the j-th signal line $DL_j$.

The sensing transistor SE is turned on by a k-th initialization signal of a k-th sense line $SE_k$ to connect a q-th reference voltage line $RL_q$ to the source electrode of the driving transistor DR. A gate electrode of the sensing transistor SE may be connected to the k-th sense line $SE_k$, a drain electrode may be connected to the q-th reference voltage line $RL_q$, and a source electrode may be connected to the drain electrode of the driving transistor DR.

The storage capacitor Cst stores differential voltage between gate voltage and source voltage of the driving transistor DR.

One-side electrode of the storage capacitor Cst may be connected to the gate electrode of the driving transistor DR and the source electrode of the switching transistor SW, and the other-side electrode may be connected to the source electrode of the driving transistor DR, the source electrode of the sensing transistor SE, and the first electrode 130 or the first electrode extension portion 130e of the light emitting element OLED.

In FIG. 3, the driving transistor DR, the switching transistor SW, and the sensing transistor SE of each of the subpixels SP are shown as being N-type semiconductor transistors having N-type semiconductor characteristics by way of example; however, the present disclosure is not limited thereto. That is, the driving transistor DR, the switching transistor SW, and the sensing transistor SE of each of the subpixels SP may be P-type semiconductor transistors having P-type semiconductor characteristics.

Figure 7A:
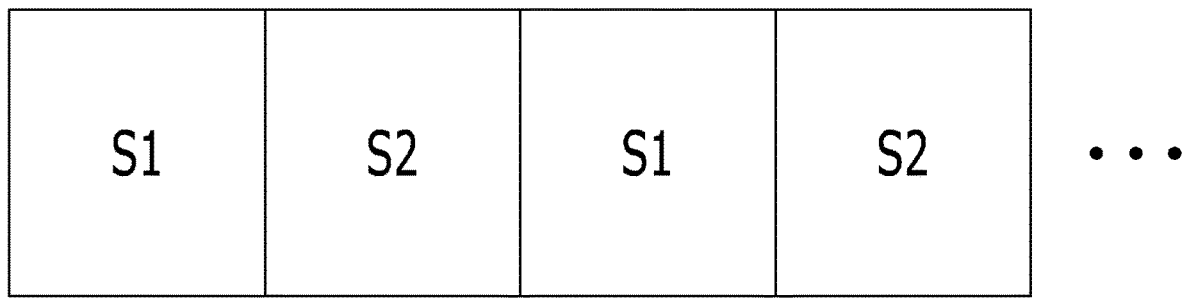
FIGS. 7A and 7B are views showing the disposition of a light emitting display device according to another aspect of the present disclosure.
Figure 7A:
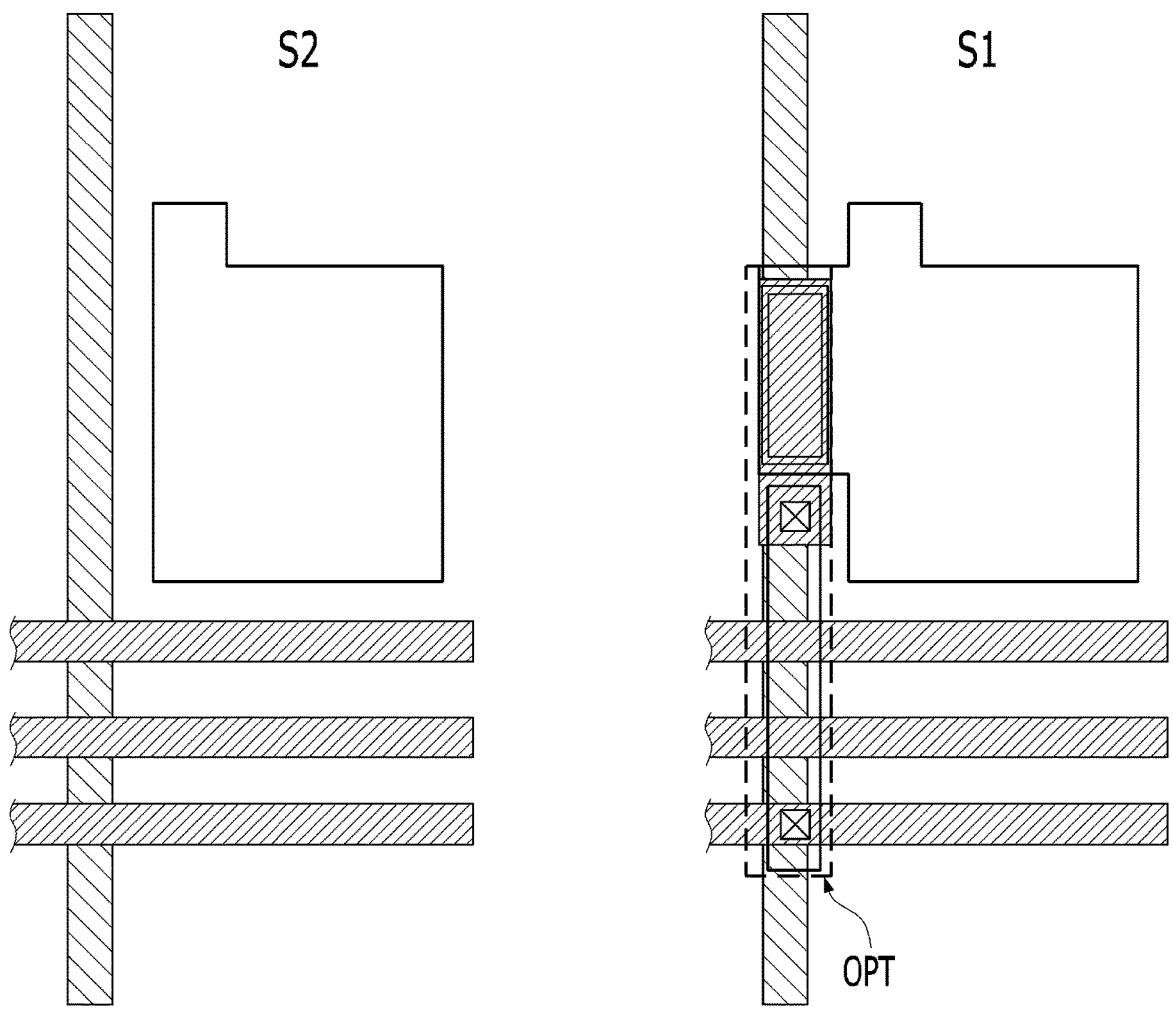
Figure 7B:
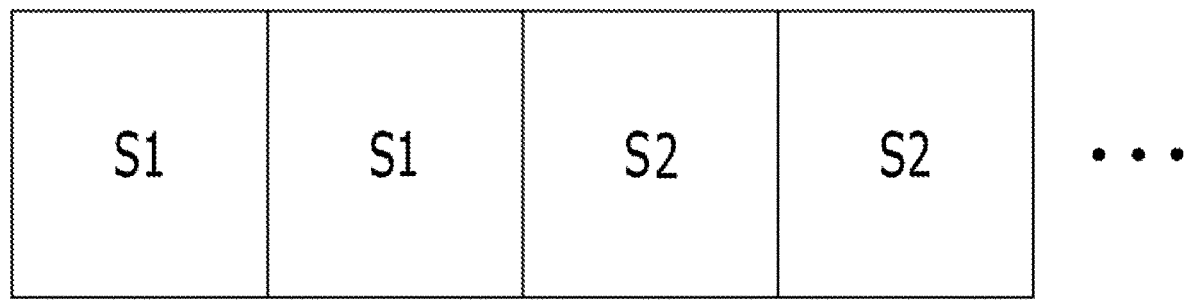
Figure 7B:
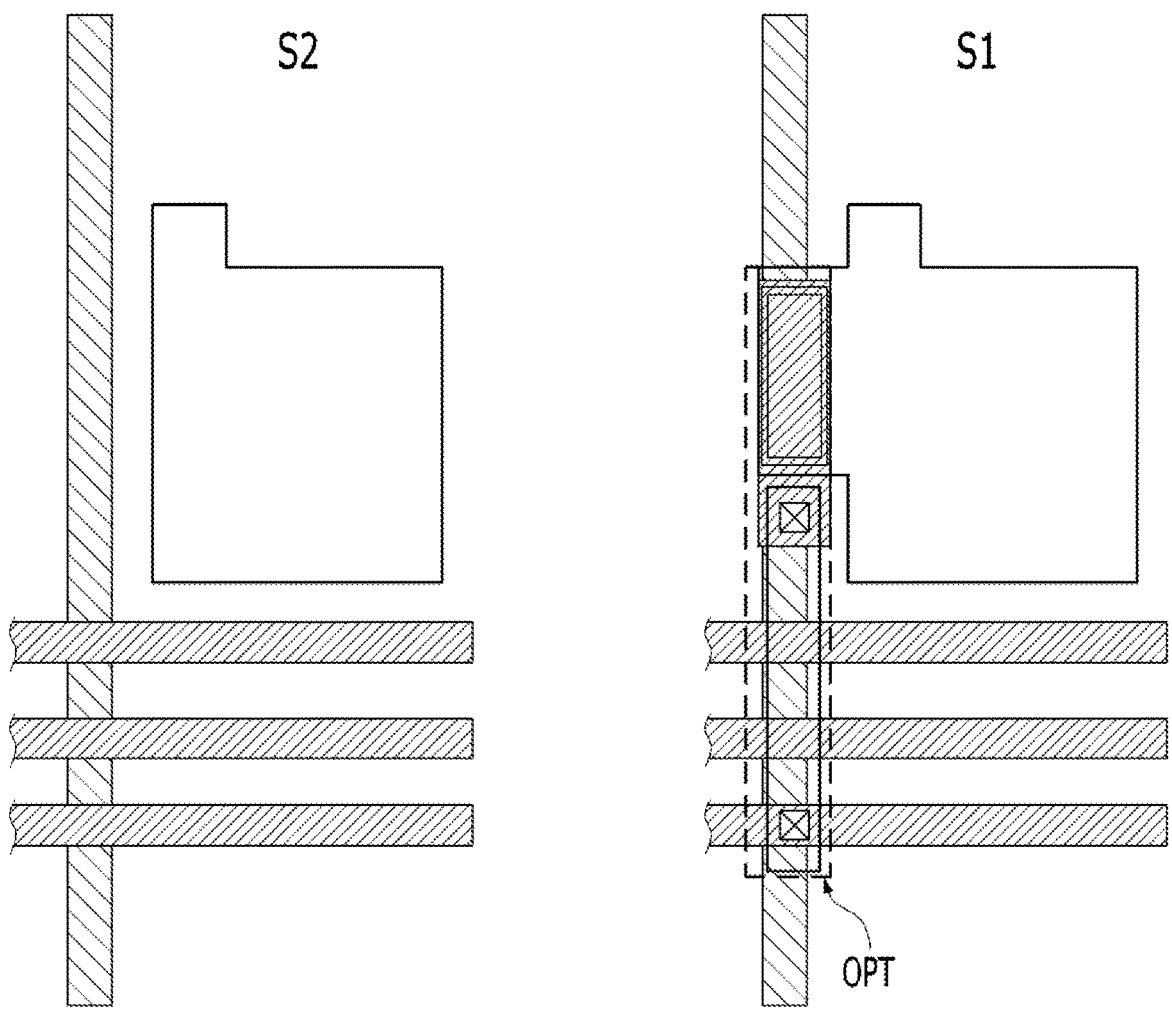

FIGS. 7A and 7B are views showing the disposition of a light emitting display device according to another aspect of the present disclosure.

FIGS. 7A and 7B are plan views showing a light emitting display device according to another aspect of the present disclosure, showing an example in which each first subpixel S1 has an optical characteristics detection portion OPT and each second subpixel S2 has no optical characteristics detection portion.

Referring to FIG. 7A, the first subpixels S1 and the second subpixels S2 are disposed adjacent to each other while being alternately disposed.

Referring to FIG. 7B, the first subpixels S1 are disposed adjacent to each other, and the second subpixels S2 are disposed adjacent to each other. FIG. 7B shows an example in which the first subpixels S1 and the second subpixels S2 are disposed adjacent to each other two by two; however, the present disclosure is not limited thereto. The first subpixels S1 and the second subpixels S2 may be repeatedly disposed adjacent to each other three or more to three or more, or the first subpixels S1 and the second subpixels S2 may be repeatedly disposed in different numbers.

When a larger number of first subpixels S1 each having an optical characteristics detection portion OPT is disposed in a display area, it is possible to detect optical characteristics of the subpixels in more detail. When the optical characteristics detection portion OPT is provided for each subpixel, as shown in FIG. 3, it is possible to detect optical characteristics of each subpixel.

Meanwhile, in the light emitting display device according to the present disclosure, the optical characteristics detection portion OPT is configured so as to overlap with a signal line provided for a pixel circuit, and therefore it is possible to detect optical characteristics of each subpixel without affecting the area of an emission portion EM. In the light emitting display device according to the present disclosure, therefore, real-time afterimage compensation is possible using the detected optical characteristics of each subpixel.

That is, a detection pattern of the optical characteristics detection portion OPT is connected to one of source voltage lines provided for the subpixels. Consequently, light emitted from a specific subpixel is received and converted into a current or voltage signal, which is read by a driver through the source voltage line, and optical characteristics of the specific subpixel are detected based on a change in the current or voltage signal, whereby real-time monitoring is possible whenever the source voltage line is sensed.

In contrast, an afterimage compensation method using an external compensation circuit is performed at a specific cycle, which is long. As a result, defects between cycles cannot be detected, and compensation therefor is difficult. For example, in general afterimage compensation, data read through an afterimage compensation line are compared with information stored in a lookup table, which is performed at a specific cycle. When the environment in which panels are placed is changed, however, the environment in which the panels are driven is changed even though the panels are the same model. In the afterimage compensation method based on comparison using only a predetermined reference value, therefore, it is difficult to appropriately compensate for different degradations due to different environments for each subpixel.

In the present disclosure, the optical characteristics detection portion is provided for each subpixel in the display area, whereby it is possible to solve the above problem. Compared to the method using the external compensation circuit, therefore, afterimage compensation and stain compensation are easy and accuracy in degradation compensation is high.

Hereinafter, a compensation method of the light emitting display device according to the present disclosure will be described.

Figure 8:
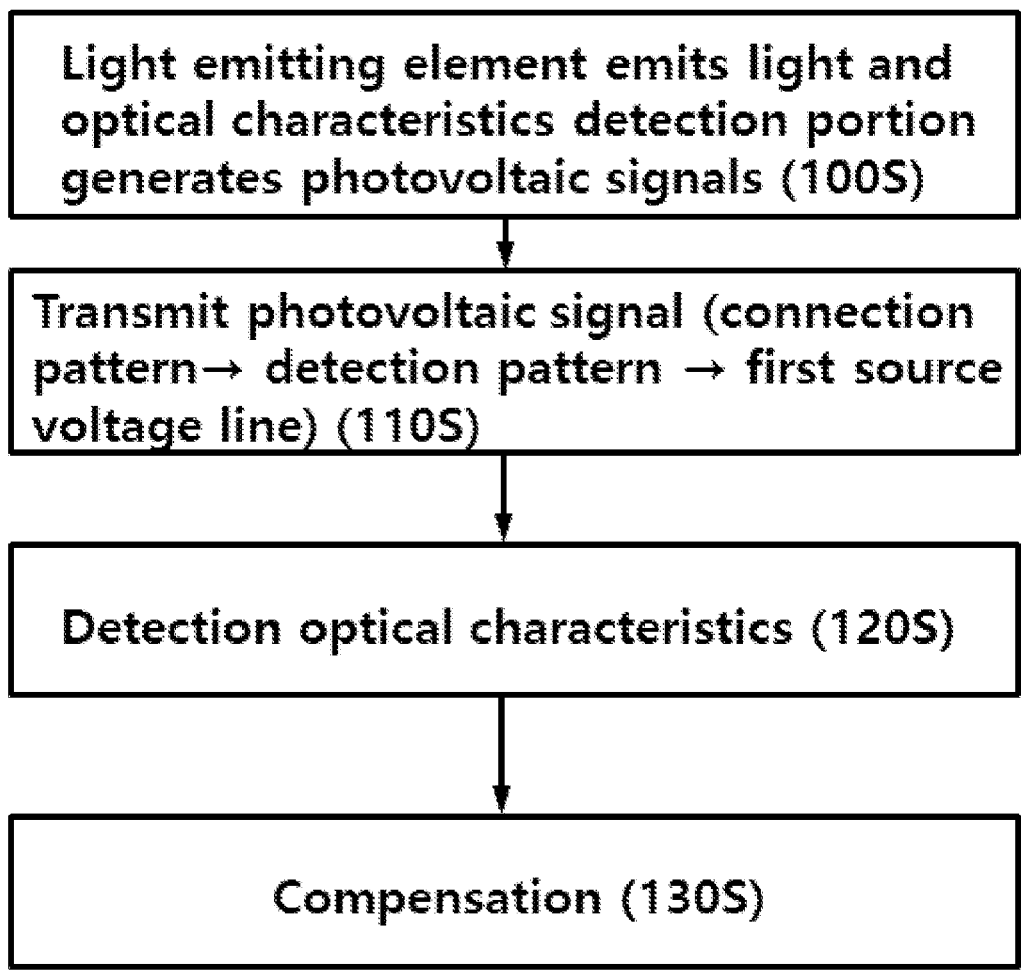
FIG. 8 is a flowchart showing a compensation method of the light emitting display device according to the present disclosure.

FIG. 8 is a flowchart showing a compensation method of the light emitting display device according to the present disclosure.

As shown in FIG. 8, the compensation method of the light emitting display device according to the present disclosure is performed in the following sequence. Hereinafter, a description will be given with reference to reference symbols mentioned in FIGS. 1 to 7B.

First, a scan signal and data voltage are supplied to a subpixel to be detected through the scan line and the signal line of the pixel circuit in order to operate the light emitting element of the emission portion in the subpixel so as to emit light, and a photovoltaic signal is generated from the photovoltaic material layer 120 of the optical characteristics detection portion in the same subpixel (100S). When light is emitted, light emitted from the organic layer of the subpixel, the light emitting element of which is operated, is transmitted to the photovoltaic material layer 120 of the optical characteristics detection portion thereunder, and the photovoltaic material layer 120 having received the light generates current.

Subsequently, the photovoltaic material layer 120 transmits the current to the first source voltage line 112 via the connection pattern 115 and the detection pattern 135 (110S). Here, the current generated from the photovoltaic material layer 120 is transmitted to the first source voltage line RL when the sensing transistor SE is turned on.

Subsequently, the driver connected to the first source voltage line to supply a first source voltage signal detects optical characteristics of the subpixel from which the photovoltaic signal has been generated (120S). The driver may be a data driver, a source voltage signal generator, or a driver including a timing controller.

The driver may compare the optical characteristics of the subpixel with a reference value, may compensate for a difference between the optical characteristics of the subpixel and the reference value based on the optical characteristics of the subpixel from which the photovoltaic signal has been generated, and may supply the compensated reference source voltage through the first source voltage line (130S). Here, the relationship between the optical characteristics of the subpixel and current that flows in the photovoltaic material in response to the characteristics of the subpixel is based on data acquired through experimentation in advance.

While a user watches the light emitting display device, a sense signal is applied to a sense line to be sensed during a period in which a screen is held between frames, current generated in the photovoltaic material is checked through the reference source voltage line, and specific data of the current are compared with the reference value to detect a change, whereby degradation of the light emitting element is checked.

Light from the light emitting element of the subpixel to be detected may be received by the optical characteristics detection portion. When the subpixel to be detected is degraded, a signal is detected through the first source voltage line, and a change is detected by the optical characteristics detection portion. Consequently, it is possible to detect degradation of the subpixel through information about emission characteristics through the optical characteristics detection portion.

When degradation of the light emitting element is detected, voltage necessary to compensate for degradation is additionally applied to the data or the compensated reference voltage is supplied to the subpixel through the first source voltage line.

In the light emitting display device according to the present disclosure, the detection pattern is provided in the pixel circuit without reducing the area of the display area of the substrate, particularly the area of the emission portion, wherein the detection pattern is provided in each subpixel, whereby it is possible to compensate for each subpixel in real time. In particular, one of the source voltage line provided in the pixel circuit is used as a means configured to detect the state of the light emitting element, whereby implementation is possible without loss of the emission portion, compared to a structure in which a separate detection pattern and a separate detection line are provided in the display area.

Also, in the light emitting display device according to the present disclosure, real-time afterimage compensation is possible using the composite structure of the photovoltaic material and the light emitting element and one of the source voltage lines.

In the light emitting display device, the light emitting diode of each subpixel emits light. When the light emitting display device is driven, emission efficiency of the light emitting diode is directly reduced due to degradation of the material constituting the light emitting diode or degradation of the element in the pixel circuit, whereby an afterimage or a stain may be displayed on the screen. For this reason, the light emitting display device requires a compensation mechanism configured to solve an afterimage or stain problem due to degradation during driving. For a known external compensation mechanism, the construction that is not substantially effective for display is provided in the display area in order to achieve connection to an external compensation circuit, whereby the effective area of the emission portion is reduced.

In the light emitting display device according to the present disclosure, afterimage compensation is possible in real time without addition of a separate line, and therefore it is not necessary to provide an additional line for compensation. Consequently, addition of cost incurred when the additional line is provided and the effect due to a reduction in effective area may be solved.

The optical characteristics detection portion capable of monitoring the state of the light emitting element in real time may be inserted, and optical characteristics may be monitored using the photovoltaic material.

Also, in the light emitting display device according to the present disclosure, information acquired from the photovoltaic material may be received through the first source voltage line, whereby it is possible to acquire subpixel-specific information in real time.

In the light emitting display device according to the present disclosure, optical characteristics may be checked in the panel during production, whereby it is possible to replace the addition of the current afterimage compensation line.

In the light emitting display device according to the present disclosure, the inspection pattern capable of checking the characteristics of the organic light emitting element is inserted into a space of the driving circuit.

Meanwhile, the compensation method of the light emitting display device uses the optical characteristics detection portion in the subpixel, wherein optical characteristics can be detected in the display panel, and therefore compensation is possible during mass production of the display panel, which is not mounted to a frame or a system.

In the compensation method of the light emitting display device according to the present disclosure, therefore, it is possible to sense emission characteristics of each subpixel without the presence of a measuring instrument configured to measure the panel outside, whereby it is possible to adjust luminance and luminance uniformity of the entirety of the panel without compensation equipment.

As is apparent from the above description, a light emitting display device according to the present disclosure and a compensation method thereof have the following effects.

In the light emitting display device according to the present disclosure, an optical characteristics detection portion is configured so as to overlap with a signal line provided for a pixel circuit, and therefore it is possible to detect optical characteristics of each subpixel without affecting the area of an emission portion. That is, a detection pattern of the optical characteristics detection portion is connected to one of source voltage lines provided for the subpixels. Consequently, light emitted from a specific subpixel is received and converted into a current or voltage signal, and optical characteristics of the specific subpixel are detected based on a change in the current or voltage signal, whereby real-time monitoring is possible whenever the source voltage line is sensed.

A light emitting display device according to an aspect of a present disclosure may comprises a substrate having a plurality of subpixels, each subpixel comprising an emission portion and a pixel circuit, a signal line and a first source voltage line provided in the pixel circuit, the signal line and the first source voltage line intersecting each other, a light emitting element provided at the emission portion, the light emitting element comprising a first electrode, an organic layer, and a second electrode, a first electrode extension portion integral with the first electrode, the first electrode extension portion extending from the first electrode to overlap with at least a part of the signal line, a connection pattern overlapping with the first electrode extension portion along the signal line, a photovoltaic material provided between the connection pattern and the first electrode extension portion; and a detection pattern spaced apart from the photovoltaic material, one side of the detection pattern being connected to the first electrode extension portion along the signal line, the other side of the detection pattern being connected to the first source voltage line.

In a light emitting display device according to an aspect of a present disclosure, the detection pattern may be made of a same material as the first electrode and is spaced apart from both the first electrode and the first electrode extension portion.

In a light emitting display device according to an aspect of a present disclosure, the organic layer may contact upper surfaces of the first electrode and the first electrode extension portion, and the organic layer may not contact the detection pattern.

In a light emitting display device according to an aspect of a present disclosure, the photovoltaic material may comprise at least one of PTB7, PTB7-Th, $PC_{71}BM$, PTDB-T, and ITIC.

A light emitting display device according to an aspect of a present disclosure may further comprise a bank having a first hole to expose the emission portion between the first electrode and the organic layer, and a second hole to expose the first electrode extension portion on the connection pattern.

A light emitting display device according to an embodiment of a present disclosure may comprise an optical characteristics detection portion overlapping the signal line. And the optical characteristics detection portion may be defined by the connection pattern and the detection pattern overlapping the signal line.

In a light emitting display device according to an aspect of a present disclosure, the pixel circuit may comprise a scan line and a sense line extending to intersect the detection pattern, a switching transistor spaced apart from the optical characteristics detection portion, the switching transistor overlapping with the scan line, a sensing transistor spaced apart from the optical characteristics detection portion, the sensing transistor overlapping with the sense line and a driving transistor spaced apart from the optical characteristics detection portion, the driving transistor comprising a gate electrode connected to the switching transistor and a source electrode connected to the first electrode or the first electrode extension portion together with the sensing transistor and a second source voltage line to supply driving source voltage to a drain electrode of the driving transistor.

In a light emitting display device according to an aspect of a present disclosure, the first source voltage line may supply reference source voltage and may sense voltage of the detection pattern in different periods.

In a light emitting display device according to an aspect of a present disclosure, the scan line and the sense line may be located on a same layer as the connection pattern. A light emitting display device according to an aspect of a present disclosure may further comprise a passivation film provided between a layer of the connection pattern, the scan line, and the sense line, and a layer of the detection pattern, the passivation film being to protect the switching transistor, the sensing transistor, and the driving transistor.

In a light emitting display device according to an aspect of a present disclosure, the passivation film may further comprise a passivation film hole to expose a part of the photovoltaic material. And the photovoltaic material may contact the first electrode extension portion via the passivation film hole.

In a light emitting display device according to an aspect of a present disclosure, the connection pattern, the photovoltaic material, and the detection pattern may be provided for each subpixel.

In a light emitting display device according to another aspect of a present disclosure, the connection pattern, the photovoltaic material, and the detection pattern may be provided for every two or more subpixels.

In a light emitting display device according to an aspect of a present disclosure, the photovoltaic material may receive light emitted from the organic layer, transmit a photovoltaic signal to the connection pattern, and transmit the photovoltaic signal to a driver outside the subpixels through the detection pattern.

In a light emitting display device according to an aspect of a present disclosure, each of the organic layer and the second electrode may integrally extend from the emission portion to the photovoltaic material of the pixel circuit.

In a light emitting display device according to an aspect of a present disclosure, the signal line may be located closer to the substrate than the connection pattern, the photovoltaic material, and the detection pattern overlapping with each other in a cross-sectional view.

A compensation method of the light emitting display device according to an aspect of a present disclosure may comprise operating a light emitting element of an emission portion in a subpixel included in the light emitting display device to emit light and generating a photovoltaic signal from photovoltaic material of a pixel circuit in the subpixel, transmitting the photovoltaic signal from the photovoltaic material to a first source voltage line via a connection pattern and a detection pattern included in the light emitting display device and detecting optical characteristics of the subpixel from which the photovoltaic signal has been generated through a driver connected to the first source voltage line.

A compensation method of the light emitting display device according to an aspect of a present disclosure may further comprise compensating for a difference between the optical characteristics of the subpixel and a reference value based on the optical characteristics of the subpixel from which the photovoltaic signal has been generated and supplying a compensated signal to the first source voltage line or a signal line.

While the aspects of the present disclosure have been described with reference to the accompanying drawings, the present disclosure is not limited to the aspects and may be embodied in various different forms, and those skilled in the art will appreciate that the present disclosure may be embodied in specific forms other than those set forth herein without departing from the technical idea and essential characteristics of the present disclosure. The disclosed aspects are therefore to be construed in all aspects as illustrative and not restrictive.

What is claimed is:

1. A light emitting display device comprising:
a substrate having a plurality of subpixels, and each subpixel comprising an emission portion and a pixel circuit;
a signal line and a first source voltage line provided in the pixel circuit, and the signal line and the first source voltage line intersecting each other;
a light emitting element provided at the emission portion, and the light emitting element comprising a first electrode, an organic layer, and a second electrode;
a first electrode extension portion integral with the first electrode, and the first electrode extension portion extending from the first electrode to overlap with at least a part of the signal line;
a connection pattern overlapping with the first electrode extension portion along the signal line;
a photovoltaic material provided between the connection pattern and the first electrode extension portion; and
a detection pattern spaced apart from the photovoltaic material,
wherein one side of the detection pattern is connected to the first electrode extension portion along the signal line, and another side of the detection pattern is connected to the first source voltage line.

2. The light emitting display device according to claim 1, wherein the detection pattern is made of a same material as the first electrode and is spaced apart from both the first electrode and the first electrode extension portion.

3. The light emitting display device according to claim 2, further comprising a bank having a first hole exposing the emission portion between the first electrode and the organic layer, and a second hole exposing the first electrode extension portion on the connection pattern.

4. The light emitting display device according to claim 1, wherein the organic layer contacts upper surfaces of the first electrode and the first electrode extension portion, and does not contact the detection pattern.

5. The light emitting display device according to claim 1, wherein the photovoltaic material comprises one of PTB7, PTB7-Th, $PC_{71}BM$, PTDB-T, and ITIC.

6. The light emitting display device according to claim 1,
wherein an optical characteristics detection portion are defined by the connection pattern and the detection pattern overlapping the signal line, and
wherein the pixel circuit comprises:
a scan line and a sense line extending to intersect the detection pattern;
a switching transistor spaced apart from the optical characteristics detection portion, and the switching transistor overlapping with the scan line;
a sensing transistor spaced apart from the optical characteristics detection portion, and the sensing transistor overlapping with the sense line;
a driving transistor spaced apart from the optical characteristics detection portion, and the driving transistor comprising a gate electrode connected to the switching transistor and a source electrode connected to the first electrode or the first electrode extension portion together with the sensing transistor; and
a second source voltage line supplying driving source voltage to a drain electrode of the driving transistor.

7. The light emitting display device according to claim 6, wherein the first source voltage line supplies reference source voltage and senses voltage of the detection pattern in different periods.

8. The light emitting display device according to claim 6, wherein the scan line and the sense line are located on a same layer as the connection pattern.

9. The light emitting display device according to claim 8, further comprising a passivation film provided between a layer of the connection pattern, the scan line, and the sense line, and a layer of the detection pattern, the passivation film being to protect the switching transistor, the sensing transistor, and the driving transistor.

10. The light emitting display device according to claim 9, wherein the passivation film further comprises a passivation film hole exposing a part of the photovoltaic material, and
wherein the photovoltaic material contacts the first electrode extension portion via the passivation film hole.

11. The light emitting display device according to claim 1, wherein the connection pattern, the photovoltaic material, and the detection pattern are provided for each subpixel.

12. The light emitting display device according to claim 1, wherein the connection pattern, the photovoltaic material, and the detection pattern are provided for at least every two subpixels.

13. The light emitting display device according to claim 1, wherein the photovoltaic material receives light emitted from the organic layer, transmits a photovoltaic signal to the connection pattern, and transmits the photovoltaic signal to a driver outside the subpixels through the detection pattern.

14. The light emitting display device according to claim 1, wherein each of the organic layer and the second electrode integrally extends from the emission portion to the photovoltaic material of the pixel circuit.

15. The light emitting display device according to claim 1, wherein the signal line is located closer to the substrate than the connection pattern, the photovoltaic material, and the detection pattern overlapping with each other in a cross-sectional view.

16. A compensation method of the light emitting display device comprising:
operating a light emitting element of an emission portion in a subpixel to emit light and generating a photovoltaic signal from photovoltaic material of a pixel circuit in the subpixel;
transmitting the photovoltaic signal from the photovoltaic material to a first source voltage line via a connection pattern and a detection pattern; and
detecting optical characteristics of the subpixel from which the photovoltaic signal has been generated through a driver connected to the first source voltage line.

17. The compensation method according to claim 16, further comprising compensating for a difference between the optical characteristics of the subpixel and a reference value based on the optical characteristics of the subpixel from which the photovoltaic signal is generated and supplying a compensated signal to the first source voltage line or a signal line.

* * * * *